United States Patent
Byun et al.

(10) Patent No.: US 9,437,518 B2
(45) Date of Patent: Sep. 6, 2016

(54) SEMICONDUCTOR MODULE

(71) Applicant: SAMSUNG ELECTRONICS CO., LTD., Suwon-si (KR)

(72) Inventors: Jaebum Byun, Suwon-si (KR); Heeyoub Kang, Seoul (KR); Dongok Kwak, Suwon-si (KR); Junghoon Kim, Hwaseong-si (KR); Joonyoung Oh, Seongnam-si (KR); Won-Hwa Lee, Seoul (KR); Jae-Woo Jeong, Seoul (KR); Jinyoung Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 14/066,008

(22) Filed: Oct. 29, 2013

(65) Prior Publication Data

US 2014/0117528 A1    May 1, 2014

(30) Foreign Application Priority Data

Oct. 29, 2012 (KR) .................. 10-2012-0120535
Sep. 13, 2013 (KR) .................. 10-2013-0110641

(51) Int. Cl.
*H01L 23/367*    (2006.01)
*H01L 23/38*    (2006.01)
*H01L 23/42*    (2006.01)
*H01L 23/552*    (2006.01)
*H01L 23/00*    (2006.01)

(52) U.S. Cl.
CPC ......... *H01L 23/3675* (2013.01); *H01L 23/367* (2013.01); *H01L 23/38* (2013.01); *H01L 23/42* (2013.01); *H01L 23/552* (2013.01); *H01L 24/06* (2013.01); *H01L 24/16* (2013.01); *H01L 24/32* (2013.01); *H01L 24/73* (2013.01); *H01L 2224/0401* (2013.01); *H01L 2224/06181* (2013.01); *H01L 2224/06183* (2013.01); *H01L 2224/16225* (2013.01); *H01L 2224/16227* (2013.01); *H01L 2224/32245* (2013.01); *H01L 2224/73253* (2013.01)

(58) Field of Classification Search
CPC . H01L 23/367; H01L 23/3675; H01L 23/34; H01L 23/36
See application file for complete search history.

(56) References Cited

U.S. PATENT DOCUMENTS

| | | | |
|---|---|---|---|
| 6,075,287 A * | 6/2000 | Ingraham et al. | 257/706 |
| 6,229,216 B1 * | 5/2001 | Ma et al. | 257/777 |
| 6,392,897 B1 * | 5/2002 | Nakase et al. | 361/785 |
| 6,424,532 B2 | 7/2002 | Kawamura | |
| 7,151,668 B1 * | 12/2006 | Stathakis | H01L 23/427 165/104.26 |
| 7,257,002 B2 | 8/2007 | Nagahashi | |
| 7,755,897 B2 | 7/2010 | Chen et al. | |
| 7,934,124 B2 | 4/2011 | Bechtolsheim et al. | |

(Continued)

FOREIGN PATENT DOCUMENTS

| | | |
|---|---|---|
| JP | 200479949 A | 3/2004 |
| JP | 200884937 A | 4/2008 |

(Continued)

*Primary Examiner* — Peniel M Gumedzoe
(74) *Attorney, Agent, or Firm* — Sughrue Mion, PLLC

(57) ABSTRACT

A semiconductor module may include a heat-transferring part connecting at least one of a control device, a buffer semiconductor device, and a memory device to a connector. The heat-transferring part may be configured to have a thermal conductivity higher than the substrate. Accordingly, during the operation of the semiconductor module, the connector can have a temperature lower than the devices.

19 Claims, 15 Drawing Sheets

(56) References Cited

U.S. PATENT DOCUMENTS

| | | |
|---|---|---|
| 7,944,703 B2 | 5/2011 | Ni et al. |
| 8,044,506 B2 | 10/2011 | Yun et al. |
| 8,139,355 B2 | 3/2012 | Motschman et al. |
| 2002/0001180 A1* | 1/2002 | Kawamura .................... 361/715 |
| 2003/0076657 A1* | 4/2003 | Summers ............ H01L 23/4093 361/719 |
| 2003/0165051 A1* | 9/2003 | Kledzik et al. ............... 361/760 |
| 2005/0117303 A1 | 6/2005 | Nagahashi |
| 2005/0201063 A1* | 9/2005 | Lee et al. ...................... 361/715 |
| 2008/0013282 A1* | 1/2008 | Hoss et al. .................... 361/715 |
| 2008/0116571 A1* | 5/2008 | Dang ................. H01L 23/3672 257/721 |
| 2008/0212297 A1 | 9/2008 | Ni et al. |
| 2008/0251911 A1* | 10/2008 | Farnsworth et al. ......... 257/714 |
| 2009/0034327 A1 | 2/2009 | Yun et al. |
| 2009/0129026 A1* | 5/2009 | Baek et al. .................... 361/710 |
| 2009/0168356 A1 | 7/2009 | Chen et al. |
| 2010/0095048 A1 | 4/2010 | Bechtolsheim et al. |
| 2010/0281280 A1* | 11/2010 | Rajan et al. .................. 713/300 |
| 2011/0058336 A1* | 3/2011 | Sundstrom .......... H05K 7/1404 361/710 |
| 2011/0286179 A1 | 11/2011 | Motschman et al. |

FOREIGN PATENT DOCUMENTS

| | | |
|---|---|---|
| KR | 100885027 A | 4/2009 |
| KR | 100982257 B1 | 9/2010 |
| KR | 101006063 B1 | 1/2011 |

\* cited by examiner

SEMICONDUCTOR MODULE

CROSS-REFERENCE TO RELATED APPLICATIONS

This application claims priority from Korean Patent Application No. 10-2012-0120535 filed on Oct. 29, 2012 in the Korean Intellectual Property Office, and Korean Patent Application No. 10-2013-0110641, filed Sep. 13, 2013 in the Korean Intellectual Property Office, the entire contents of which are hereby incorporated by reference.

BACKGROUND

Apparatuses consistent with exemplary embodiments of the present disclosure relate to a semiconductor device, and in particular, to a solid state drive module.

Recently, large-capacity digital media storages, such as solid state drives (SSDs), have been introduced. A solid state drive can provide superior read and write performance compared to a hard disk drive. Further, since the solid state drive can be operated with low power, it can be effectively applied to realize low power consuming digital devices, such as notebook computers. However, as speed and capacity of solid state drives increase, there is an increasing demand for solid state drives with improved heat-dissipation property.

SUMMARY

Exemplary embodiments provide a semiconductor module which may have an improved heat-dissipation property and high reliability.

According to an aspect of an exemplary embodiment, there is provided a semiconductor module including a substrate, a control device, a buffer semiconductor device, and a first memory device mounted on a bottom surface of the substrate, a lower heat-transferring part contacting the control device, and a connector provided on a side surface of the substrate and contacting the lower heat-transferring part.

The lower heat-transferring part may have thermal conductivity higher than the substrate.

The lower heat-transferring part may include a lower thermal path, and a lower pad provided between the lower thermal path and the connector and between the lower thermal path and the control device.

The lower heat-transferring part may extend to cover the buffer semiconductor device, and the pad may extend between the buffer semiconductor device and the connector.

The lower heat-transferring part may extend to cover the first memory device, and the pad may extend between the first memory device and the connector.

The semiconductor module may further include interconnection lines contacting the substrate and the connector. The interconnection lines may include a power/signal interconnection line spaced apart from the lower heat-transferring part, and a ground interconnection line being in contact with the lower heat-transferring part.

The semiconductor module may further include a passive device pad on a top surface of the substrate, a passive device on the passive device pad, a thermoelectric pad on the passive device, and a case being in contact with the thermoelectric pad and surrounding the substrate, the passive device pad, the passive device, and the thermoelectric pad.

According to an aspect of another exemplary embodiment, there is provided a semiconductor module including a substrate, a control device, a buffer semiconductor device, and a first memory device mounted on a bottom surface of the substrate, a second memory device mounted on a top surface of the substrate, an upper heat-transferring part provided on the top surface of the substrate and contacting the second memory device, and a connector provided on a side surface of the substrate and contacting the upper heat-transferring part.

The upper heat-transferring part may have thermal conductivity higher than the substrate.

The semiconductor module may further include a lower heat-transferring part configured to be in contact with at least one of the connector, the control device, the buffer semiconductor device, or the first memory device.

The upper heat-transferring part may extend along the side surface of the substrate and may contact to the lower heat-transferring part, and the substrate may be enclosed by the upper and lower heat-transferring parts.

The upper heat-transferring part may have a top surface facing the substrate and having a groove, zigzag, or uneven shape.

BRIEF DESCRIPTION OF THE DRAWINGS

The and/or other aspects will become apparent and more readily appreciated from the following description of exemplary embodiments, taken in conjunction with the accompanying drawings in which.

DETAILED DESCRIPTION

Figure 1:
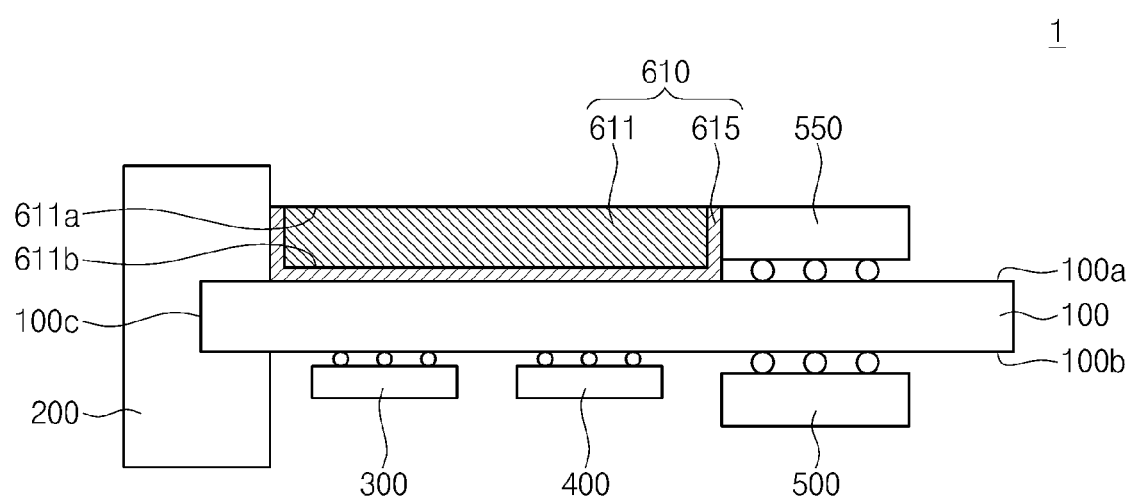
FIG. 1 is a sectional view illustrating a semiconductor module according to an exemplary embodiment.

Exemplary embodiments will now be described more fully with reference to the accompanying drawings, in which exemplary embodiments are shown. Exemplary embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

It should be noted that the drawings are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. In the drawings, the thicknesses of layers and regions are exaggerated for clarity Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which exemplary embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a semiconductor module according to an exemplary embodiment.

Referring to FIG. 1, a semiconductor module 1 may include a connector 200, which is connected to a substrate 100, and a control device 300, a buffer semiconductor device 400, a first memory device 500, a second memory device 550, and an upper heat-transferring part 610 that are provided on or under the substrate 100. The control device 300, the buffer semiconductor device 400, the first memory device 500, and the second memory device 550 may be electrically connected to the substrate 100 through bonding wires, solder balls, flip-chip bonding elements, bumps, conductive vias (e.g., though-silicon via (TSV)), and/or any combination thereof.

The substrate 100 may be a printed circuit board (PCB). The substrate 100 may have a bottom surface 100b, a top surface 100a opposite the bottom surface 100b, and a first side surface 100c connecting edges of the top and bottom surfaces 100a and 100b. The substrate 100 may be a structure containing ceramics, silicon, and/or glass.

The control device 300 may be mounted on the bottom surface 100b of the substrate 100. The control device 300 may be configured to control data transmission to the first memory device 500 and/or the second memory device 550. The control device 300 may be provided in the form of a semiconductor die or a semiconductor package.

The buffer semiconductor device 400 may be mounted on the bottom surface 100b of the substrate 100. The buffer semiconductor device 400 may be configured to temporarily store data to be stored in the first memory device 500 and/or the second memory device 550 or store data read out from the first memory device 500 and/or the second memory device 550. The buffer semiconductor device 400 may include one or more semiconductor die or package. The buffer semiconductor device 400 may include a random-accessible volatile memory device, such as a dynamic random-access memory (DRAM) or a static random-access memory (SRAM).

The first memory device 500 may be mounted on the bottom surface 100b of the substrate 100. The first memory device 500 may be a data storage including one or more semiconductor packages. The first memory device 500 may include at least one nonvolatile memory devices, such as NAND FLASH memory devices, phase-changeable random access memory (PRAM) devices, resistive RAM (RRAM) devices, ferroelectric RAM (FeRAM) devices, or magnetic RAM (MRAM) devices.

The second memory device 550 may be mounted on the top surface 100a of the substrate 100. The second memory device 550 may be a memory device similar to the first memory device 500.

The connector 200 may be provided on the first side surface 100c of the substrate 100. The connector 200 may be a serial advanced technology attachment (SATA) connector or a serial-attached SCSI (SAS) connector. The connector 200 may allow the semiconductor module 1 to be connected to an external device. During the operation of the semiconductor module 1, a temperature of the connector 200 may be lower than temperatures of the control device 300, the buffer semiconductor device 400, the first memory device 500, and the second memory device 550. The connector 200 may be in contact with the upper heat-transferring part 610.

The upper heat-transferring part 610 may be disposed on the top surface 100a of the substrate 100 to be in contact with the second memory device 550. The upper heat-transferring part 610 may include an upper thermal path 611 and an upper pad 615. The upper heat-transferring part 610 may be configured to have a higher thermal conductivity than that of air (of about 0.029 W/mK) and the substrate 100.

For example, the upper thermal path 611 may include a highly-conductive material, such as metal or graphite. In other exemplary embodiments, the upper thermal path 611 may include a heat pipe or a thermal electric cooler (TEC). During the operation of the semiconductor module 1, heat generated in the second memory device 550 may be dissipated to the connector 200 through the upper heat-transferring part 610. Further, heat generated in the control device 300, the buffer semiconductor device 400, and the first memory device 500 may be dissipated to the connector 200 through the substrate 100 and the upper heat-transferring part 610.

The upper thermal path 611 may have various shapes. For example, the upper thermal path 611 may be shaped like a bar or a plate or have a curved shape. The upper thermal path 611 may extend to cover at least one of top surfaces of the connector 200 and the second memory device 550. The upper thermal path 611 may include a first surface 611a and a second surface 611b facing each other. The second surface 611b of the upper thermal path 611 may be adjacent to the top surface 100a of the substrate 100. The second surface 611b of the upper thermal path 611 may be flat. The first surface 611a of the upper thermal path 611 may be exposed to the outside. In exemplary embodiments, the upper thermal path 611 may serve as an outer case of the semiconductor module 1 and protect the semiconductor module 1 against an external stress.

Figure 2A:
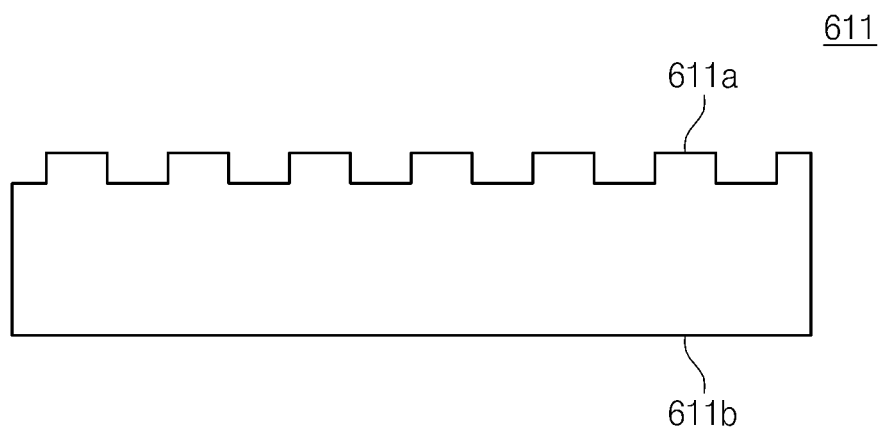
FIGS. 2A through 2C are sectional views illustrating a second surface of a thermal path according to exemplary embodiments.
Figure 2B:
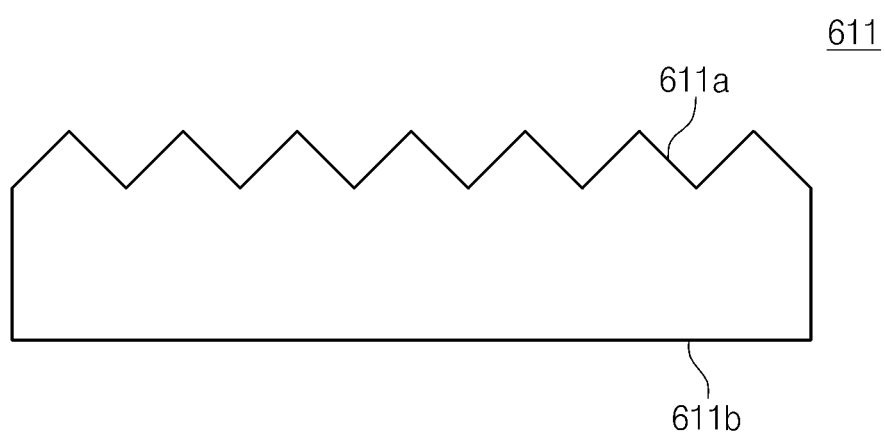
Figure 2C:
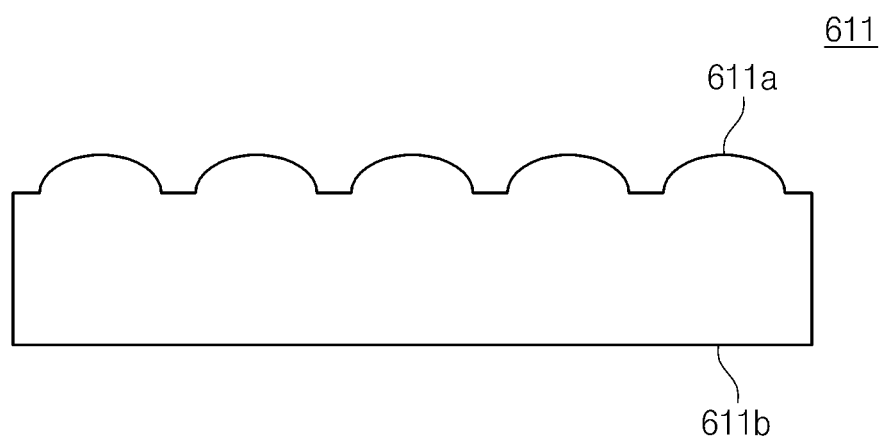

FIGS. 2A through 2C are sectional views illustrating examples of an upper thermal path according to exemplary embodiments.

Referring to FIG. 2A, the first surface 611a of the upper thermal path 611 may be formed to have a groove-shaped or rectangular saw-tooth shaped structure. Referring to FIG. 2B, the first surface 611a of the upper thermal path 611 may be formed to have a zigzag-shaped or triangular saw-tooth shaped structure. Referring to FIG. 2C, the first surface 611a of the upper thermal path 611 may be formed to have an uneven or concavo-convex structure. A portion of the heat transmitted to the upper thermal path 611 may be exhausted to the outside through the first surface 611a. Due to the uneven structure of the first surface 611a shown in FIGS. 2A through 2C, the upper thermal path 611 can have an increased surface area in contact with the outer air. Accordingly, the semiconductor module 1 can have improved heat-dissipation.

Referring back to FIG. 1, the upper pad 615 may include portions interposed between the upper thermal path 611 and the connector 200, between the upper thermal path 611 and the second memory device 550, and between the upper thermal path 611 and the top surface 100a of the substrate 100. The upper pad 615 may include a thermal interface material (TIM). The upper pad 615 provided between the upper thermal path 611 and the substrate 100 may include an insulating material. The upper pad 615 may be configured to relieve an impact exerted to the semiconductor module 1 when the semiconductor module 1 is connected to an external device.

Figure 3:
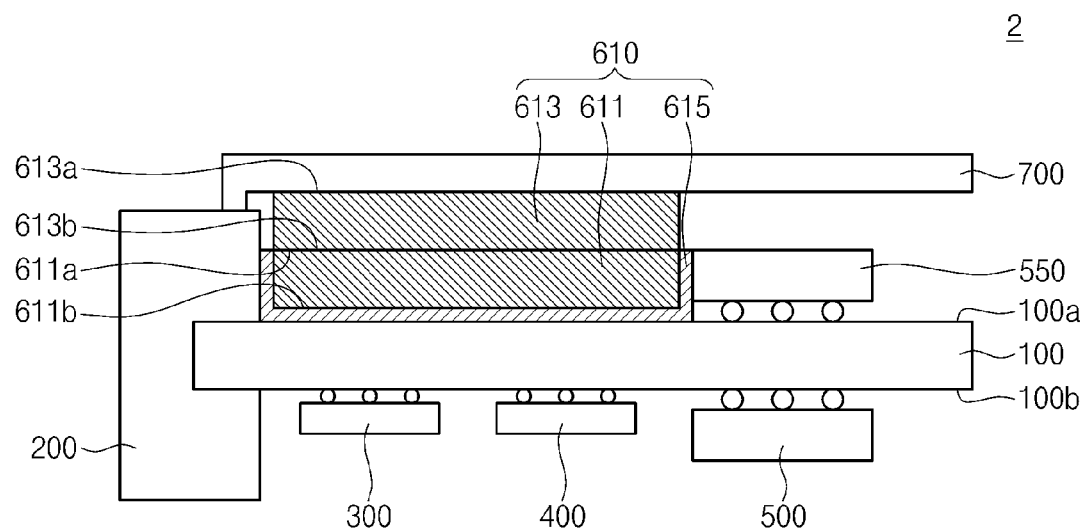
FIGS. 3 through 12 are sectional views illustrating semiconductor modules according to other exemplary embodiments.

FIG. 3 is a sectional view illustrating a semiconductor module according to another exemplary embodiment. For the sake of brevity, the elements and features of this example that are similar to those previously shown and described will not be described in much further detail.

Referring to FIG. 3, a semiconductor module 2 may include the substrate 100, the connector 200, the control device 300, the buffer semiconductor device 400, the first memory device 500, the second memory device 550, the upper heat-transferring part 610, and a case 700.

The case 700 may be provided to enclose the semiconductor module 2 and protect the semiconductor module 2 against an external stress. In certain embodiments, a portion of the case 700 may be omitted. The case 700 may include a metallic material and/or a polymer.

The upper heat-transferring part 610 may be disposed on the top surface 100a of the substrate 100 and between the connector 200 and the second memory device 550. The upper heat-transferring part 610 may include the upper thermal path 611, an upper supplementary thermal path 613, and the upper pad 615. The first surface 611a and the second surface 611b of the upper thermal path 611 may be flat. The upper supplementary thermal path 613 may be interposed between the upper thermal path 611 and the case 700. The upper thermal path 611 may be connected to the case 700 through the upper supplementary thermal path 613. The upper supplementary thermal path 613 may have a top surface 613a and a bottom surface 613b that are flat. The upper supplementary thermal path 613 may include substantially the same or similar material as the upper thermal path 611. During the operation of the semiconductor module 2, heat generated in the second memory device 550 may be transferred to the connector 200 through the upper heat-transferring part 610 and the case 700. A portion of the heat transmitted to the upper heat-transferring part 610 may be exhausted to the outside through the case 700, and this makes it possible to further improve heat dissipation of the semiconductor module 1. In other exemplary embodiments, the upper supplementary thermal path 613 may be omitted, and the upper thermal path 611 may be in contact with the case 700.

Figure 4:
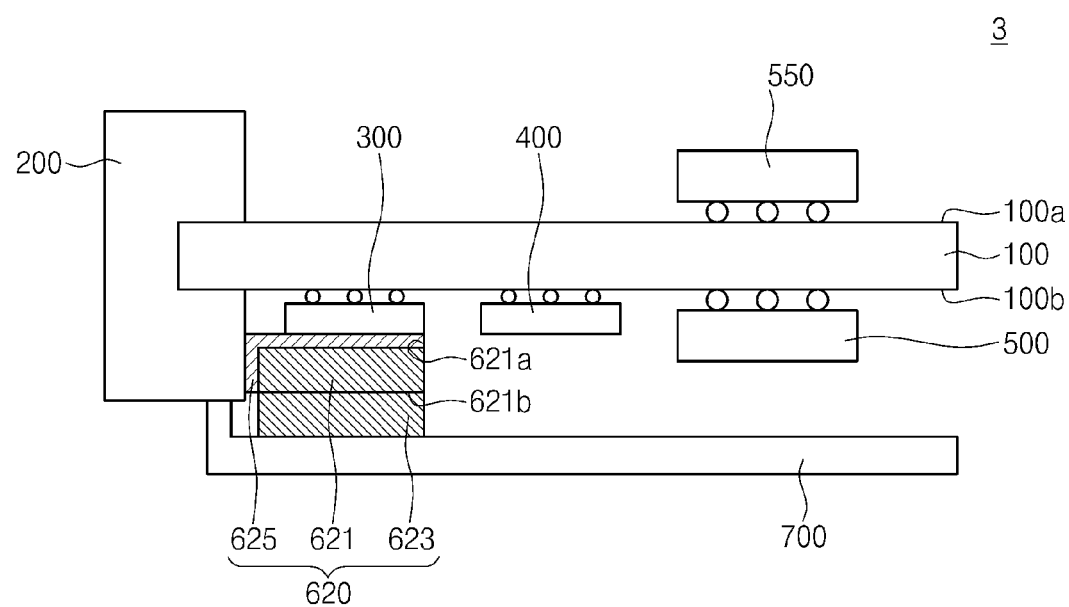

FIG. 4 is a sectional view illustrating a semiconductor module according to another exemplary embodiment. For the sake of brevity, the elements and features of this example that are similar to those previously shown and described will not be described in much further detail.

Referring to FIG. 4, a semiconductor module 3 may include the substrate 100, the connector 200, the control device 300, the buffer semiconductor device 400, the first memory device 500, the second memory device 550, a lower heat-transferring part 620, and the case 700.

The lower heat-transferring part 620 may be provided below the bottom surface 100b of the substrate 100 to be in contact with the connector 200 and the control device 300. The lower heat-transferring part 620 may include a lower thermal path 621, a lower supplementary thermal path 623, and an upper pad 625. In exemplary embodiments, the lower thermal path 621 may extend to cover a bottom surface of the connector 200. The lower thermal path 621 may have various shapes. For example, the lower thermal path 621 may be shaped like a bar or a plate or have a curved shape. The lower supplementary thermal path 623 may be provided between the lower thermal path 621 and the case 700. In other exemplary embodiments, the lower supplementary thermal path 623 may be omitted, and the lower thermal path 621 may be in contact with the case 700. In still other exemplary embodiments, the lower supplementary thermal path 623 and the case 700 may be omitted, and in this case, a second surface 621b of the lower thermal path 621 may be exposed to the outside. Similar to a first surface 611a of the upper thermal path 611 described with reference to FIGS. 2A through 2C, the second surface 621b may have the uneven (e.g., groove-shaped, concavo-convex, or zigzag) structure. In this case, the lower thermal path 621 may serve as a case. The upper pad 625 may be interposed between the lower thermal path 621 and the connector 200 and between the lower thermal path 621 and the control device 300. The upper pad 625 may include a thermal interface material (TIM) or an insulating material.

During the operation of the semiconductor module 2, a temperature of the connector 200 may be lower than that of the control device 300. Heat generated in the control device 300 may be transferred or dissipated to the connector 200 through the lower heat-transferring part 620. Heat generated in the buffer semiconductor device 400, the first memory device 500, and the second memory device 550 may be transferred to the lower heat-transferring part 620 through the substrate 100. A portion of the heat transferred to the lower thermal path 621 may be transferred or dissipated to the case 700 through the lower supplementary thermal path 623.

Figure 5:
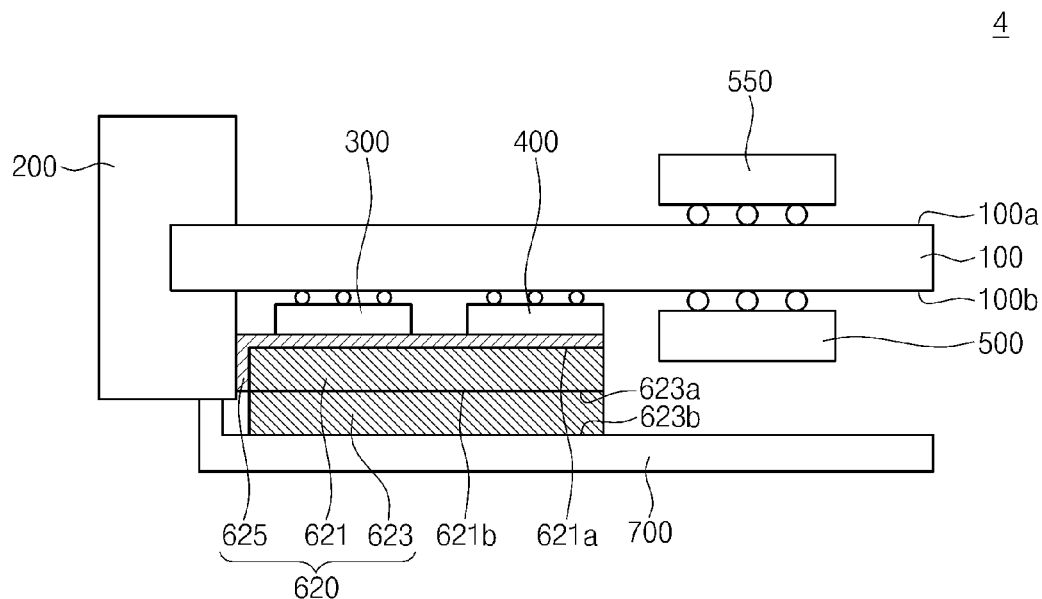

FIG. 5 is a sectional view illustrating a semiconductor module according to another exemplary embodiment. For the sake of brevity, the elements and features of this example that are similar to those previously shown and described will not be described in much further detail.

Referring to FIG. 5, a semiconductor module 4 may include the substrate 100, the connector 200, the control device 300, the buffer semiconductor device 400, the first memory device 500, the second memory device 550, the lower heat-transferring part 620, and the case 700.

The lower heat-transferring part 620 may be provided below the bottom surface 100b of the substrate 100 to be in contact with the connector 200, the control device 300, and the buffer semiconductor device 400. During the operation of the semiconductor module 4, heat generated in the control device 300 and the buffer semiconductor device 400 may be transferred to the connector 200 through the lower heat-transferring part 620. The lower pad 625 may be provided between the lower thermal path 621 and the connector 200, between the lower thermal path 621 and the control device 300, and between the lower thermal path 621 and the buffer semiconductor device 400. In other exemplary embodiments, the lower heat-transferring part 620 may not be in contact with the control device 300.

The case 700 may be in contact with the lower heat-transferring part 620. In other exemplary embodiments, the case 700 and the lower supplementary thermal path 623 may be omitted, and in this case, the second surface 621b of the lower thermal path 621 may be exposed to the outside and have the uneven (e.g., groove-shaped, concavo-convex, or zigzag) structure as described above with reference to FIGS. 2A through 2C. Here, the lower thermal path 621 may serve as a case.

Figure 6:
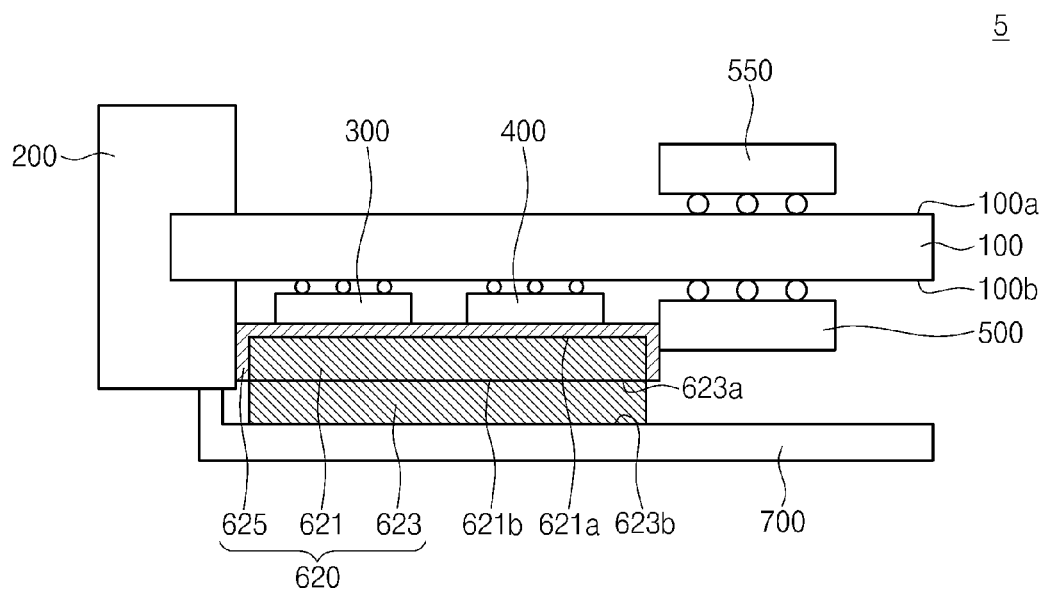

FIG. 6 is a sectional view illustrating a semiconductor module according to another exemplary embodiment. For the sake of brevity, the elements and features of this example that are similar to those previously shown and described will not be described in much further detail.

Referring to FIG. 6, a semiconductor module 5 may include the substrate 100, the connector 200, the control device 300, the buffer semiconductor device 400, the first memory device 500, the second memory device 550, the lower heat-transferring part 620, and the case 700.

The lower heat-transferring part 620 may be provided below the bottom surface 100b of the substrate 100 to be in contact with both of the connector 200 and the first memory device 500. During the operation of the semiconductor module 5, heat generated in the first memory device 500 may be transferred to the connector 200 through the lower heat-transferring part 620. The lower heat-transferring part 620 may include the lower thermal path 621, the lower supplementary thermal path 623, and the lower pad 625. The lower thermal path 621 may be provided between the memory device 500 and the connector 200. In other exemplary embodiments, the lower supplementary thermal path 623 may be omitted, and the lower thermal path 621 may be in contact with the case 700. In still other exemplary embodiments, the lower supplementary thermal path 623 and the case 700 may be omitted. In this case, the lower thermal path 621 may serve as a case. The lower heat-transferring part 620 may be in contact with the control device 300, thereby transferring heat generated in the control device 300 to the connector 200. The lower heat-transferring part 620 may be in contact with the buffer semiconductor 400. Heat generated in the buffer semiconductor 400 may be transferred to the connector 200 through the lower heat-transferring part 620. The lower pad 625 may be provided between the lower thermal path 621 and the connector 200, between the lower thermal path 621 and the control device 300, and between the lower thermal path 621 and the buffer semiconductor 400.

Figure 7:
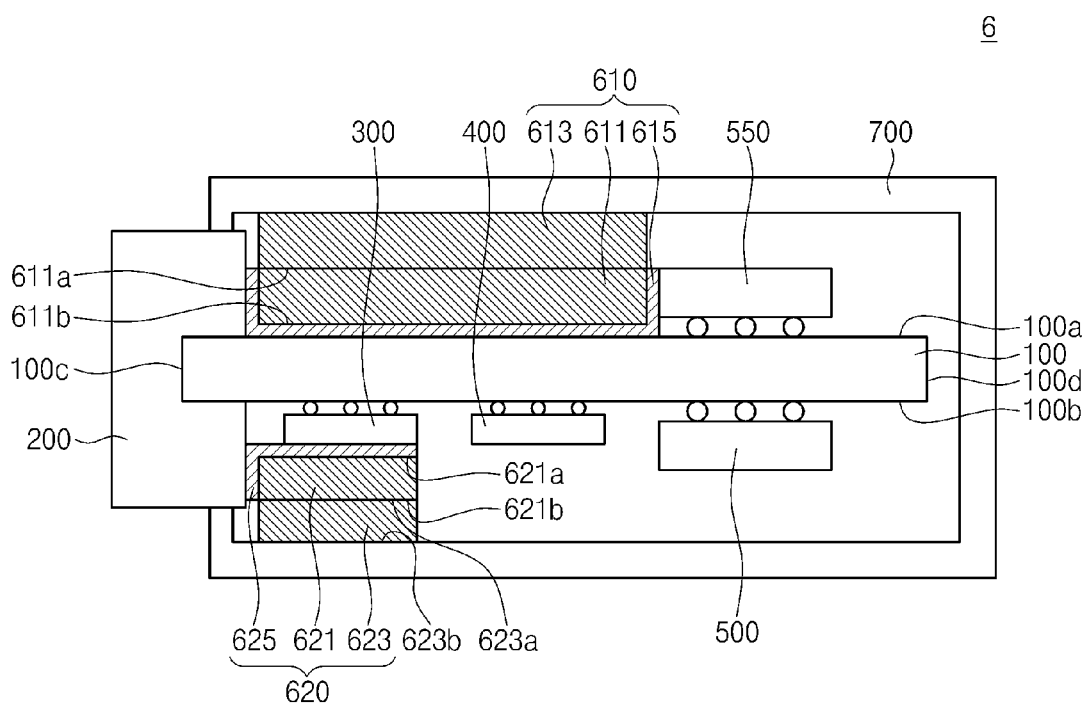

FIG. 7 is a sectional view illustrating a semiconductor module according to another exemplary embodiment. For the sake of brevity, the elements and features of this example that are similar to those previously shown and described will not be described in much further detail.

Referring to FIG. 7, a semiconductor module 6 may include the substrate 100, the connector 200, the control device 300, the buffer semiconductor device 400, the first memory device 500, the second memory device 550, the lower heat-transferring part 620, the upper heat-transferring part 610, and the case 700. The lower heat-transferring part 620 may be configured to have the same or similar features as the lower heat-transferring part 620 of FIG. 4. For example, the lower heat-transferring part 620 may be in contact with both of the control device 300 and the connector 200. The upper heat-transferring part 610 may be configured to have the same or similar features as that described with reference to FIG. 1 or FIG. 3. For example, the upper heat-transferring part 610 may be disposed on the top surface 100a of the substrate 100 to be in contact with both of the connector 200 and the second memory device 550.

The case 700 may be in contact with both of the lower heat-transferring part 620 and the upper heat-transferring part 610. The case 700 may be provided on the top surface 100a, the bottom surface 100b, and a second side surface 100d of the substrate 100 to surround the substrate 100. The second side surface 100d may be a surface facing the first side surface 100c.

Figure 8:
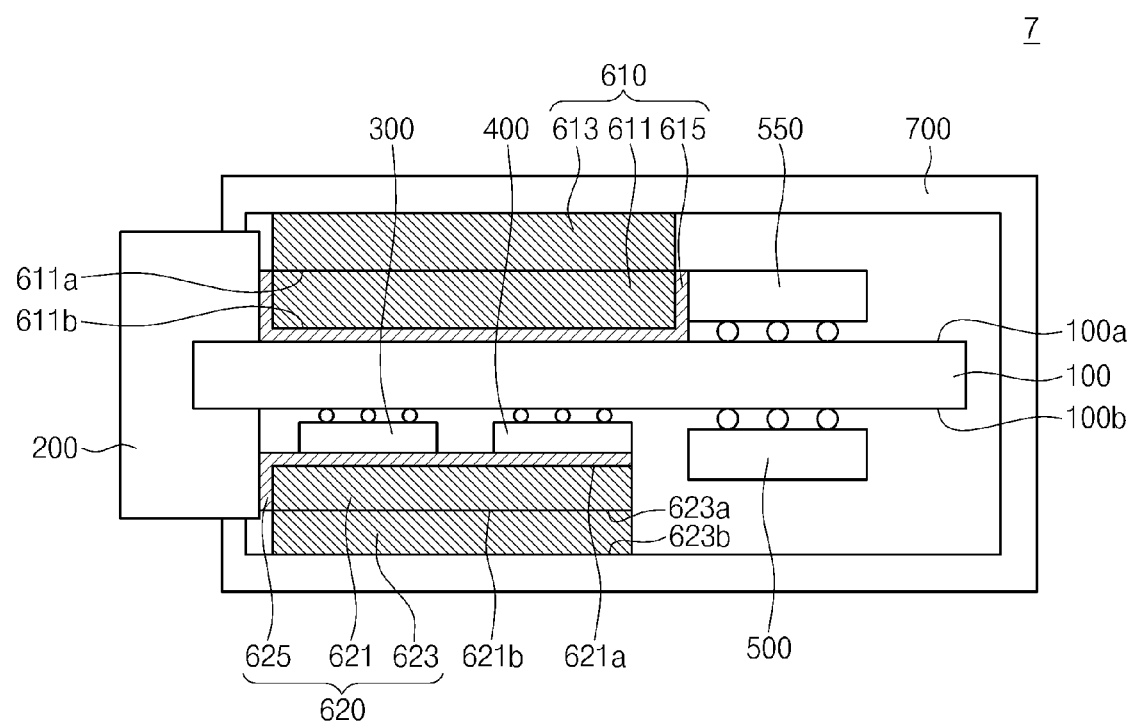

FIG. 8 is a sectional view illustrating a semiconductor module according to another exemplary embodiment. For the sake of brevity, the elements and features of this example that are similar to those previously shown and described will not be described in much further detail.

Referring to FIG. 8, a semiconductor module 7 may include the substrate 100, the connector 200, the control device 300, the buffer semiconductor device 400, the first memory device 500, the second memory device 550, the lower heat-transferring part 620, the upper heat-transferring part 610, and the case 700.

The upper heat-transferring part 610 may be configured to have the same or similar features as the upper heat-transferring part 610 of FIG. 3. The lower heat-transferring part 620 may be configured to have the same or similar features as that of FIG. 5. For example, the lower heat-transferring part 620 may be provided below the bottom surface 100b of the substrate 100 to be in contact with the connector 200, the control device 300, and the buffer semiconductor device 400.

Figure 9:
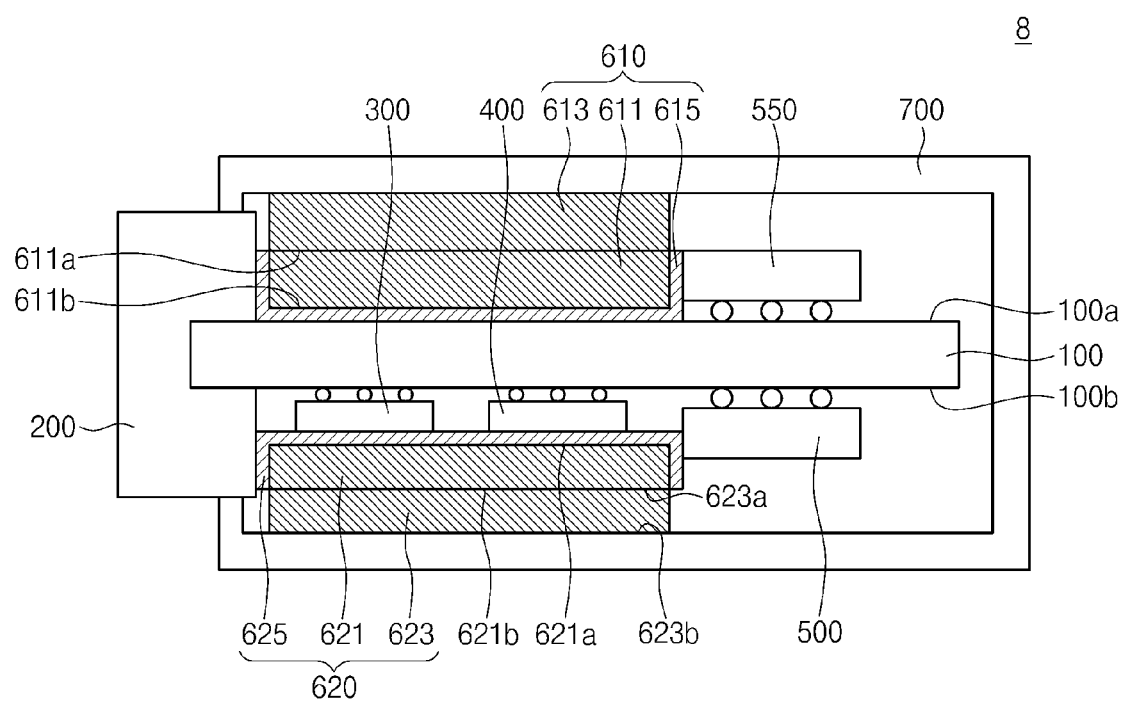

FIG. 9 is a sectional view illustrating a semiconductor module according to another exemplary embodiment. For the sake of brevity, the elements and features of this example that are similar to those previously shown and described will not be described in much further detail.

Referring to FIG. 9, a semiconductor module 8 may include the substrate 100, the connector 200, the control device 300, the buffer semiconductor device 400, the first memory device 500, the second memory device 550, the lower heat-transferring part 620, the upper heat-transferring part 610, and the case 700.

The lower heat-transferring part 620 may be configured to have the same or similar features as the lower heat-transferring part 620 of FIG. 6. For example, the lower heat-transferring part 620 may be disposed on the bottom surface 100b of the substrate 100 and between the connector 200 and the first memory device 500. The lower heat-transferring part 620 may be in contact with at least one of the connector 200, the control device 300, the buffer semiconductor device 400, or the first memory device 500. The upper heat-transferring part 610 may be configured to have the same or similar features as that of FIG. 1 or FIG. 3.

Figure 10:
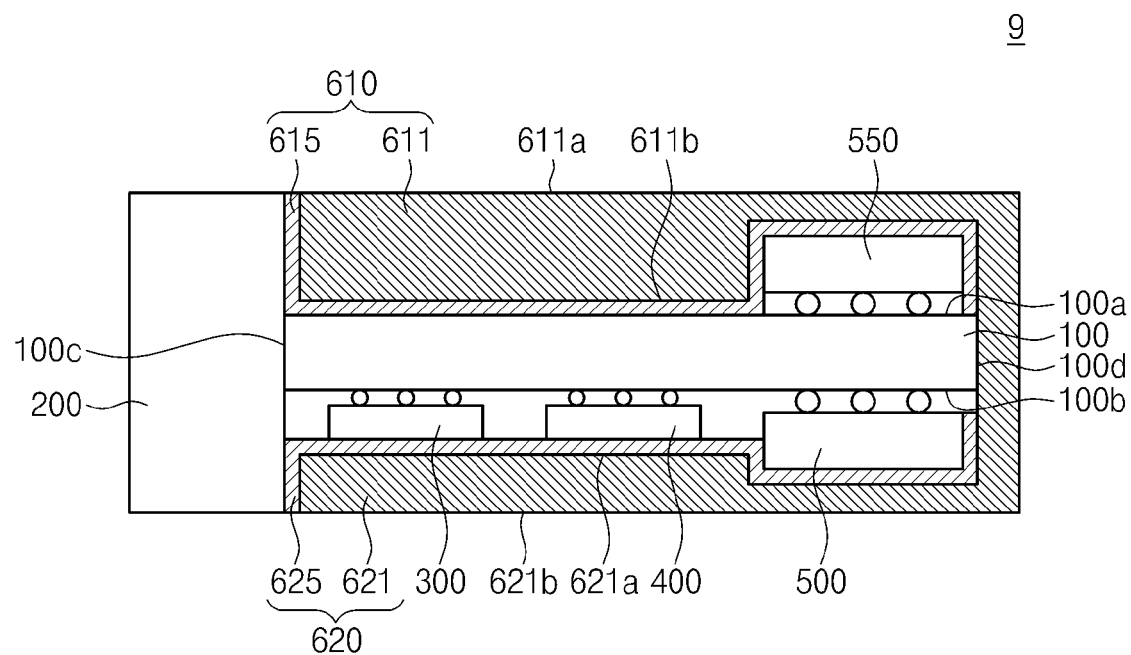

FIG. 10 is a sectional view illustrating a semiconductor module according to another exemplary embodiment. For the sake of brevity, the elements and features of this example that are similar to those previously shown and described will not be described in much further detail.

Referring to FIG. 10, a semiconductor module 9 may include the substrate 100, the connector 200, the control device 300, the buffer semiconductor device 400, the first memory device 500, the second memory device 550, the lower heat-transferring part 620, and the upper heat-transferring part 610.

The lower heat-transferring part 620 may include the lower thermal path 621 and the lower pad 625. The upper heat-transferring part 610 may include the upper thermal path 611 and the upper pad 615. The lower thermal path 621 and the upper thermal path 611 may be provided to surround the substrate 100, thereby serving as a case. For example, the lower thermal path 621 may be provided on the bottom surface 100b of the substrate 100 and be further extended to cover the second side surface 100d of the substrate 100. In other exemplary embodiments, the upper thermal path 611 may be provided on the top surface 100a of the substrate 100 and include a portion extending along the second side surface 100d of the substrate 100. The lower thermal path 621 may be connected to the upper thermal path 611. The second surface 621b of the lower thermal path 621 and the first surface 611a of the upper thermal path 611 may be exposed to the outside. The second surface 621b of the lower thermal path 621 and the first surface 611a of the upper thermal path 611 may have the uneven (e.g., groove-shaped, concavo-convex, or zigzag) structure described with reference to FIGS. 2A through 2C. Accordingly, the lower and upper thermal paths 621 and 611 may have an increased surface area to be in contact with an outer air. During the operation of the semiconductor module 9, heat generated in the devices 300, 400, 500, and 550 may be transferred or dissipated to the connector 200 or the outer air through the heat-transferring parts 610 and 620.

Figure 11:
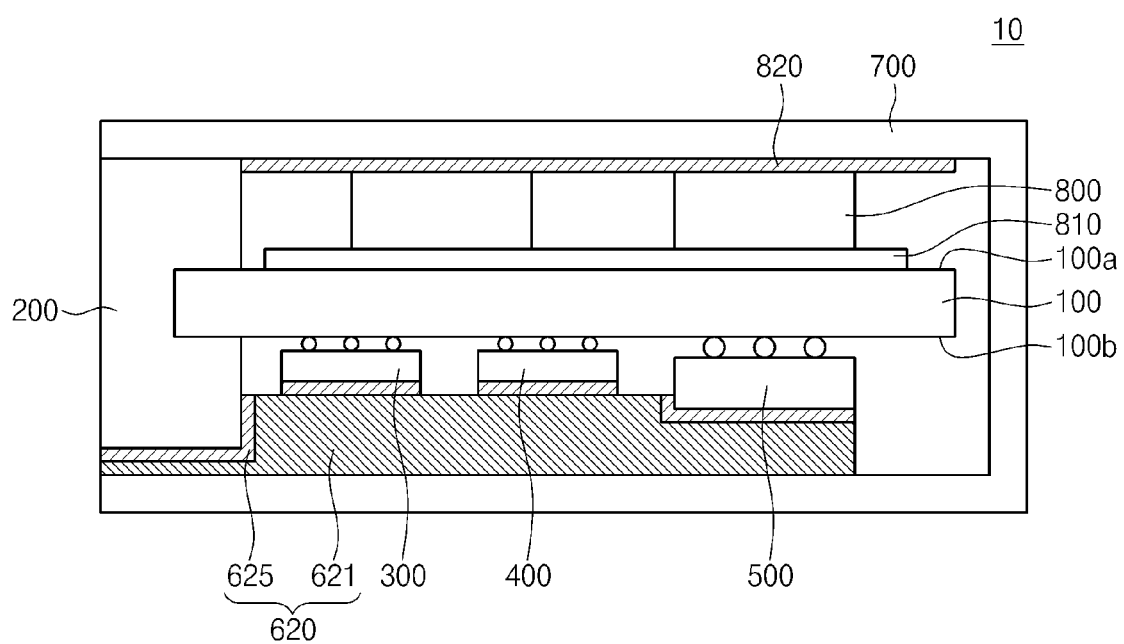

FIG. 11 is a sectional view illustrating a semiconductor module according to another exemplary embodiment. For the sake of brevity, the elements and features of this example that are similar to those previously shown and described will not be described in much further detail.

Referring to FIG. 11, a semiconductor module 10 may include the substrate 100, the connector 200, the control device 300, the buffer semiconductor device 400, the first memory device 500, the lower heat-transferring part 620, the case 700, a passive device 800, a passive device pad 810, and a thermoelectric pad 820. In exemplary embodiments, the semiconductor module 10 may be a large memory capacity module (e.g., having 200 GB or more). The lower heat-transferring part 620 may be configured to have the same or similar features as those described with reference to FIGS. 4 through 6.

The passive device 800 may be provided on the top surface 100a of the substrate 100. The passive device 800 may include a super capacitor. The passive device 800 may be electrically connected to the substrate 100. The passive device 800 may be configured to supply emergency power to the electric components of the semiconductor module 10, when power is interrupted, thereby preventing data from being lost. The passive device pad 810 may be interposed between the substrate 100 and the passive device 800. For example, the passive device pad 810 may include a thermal interface material (TIM). The passive device pad 810 may absorb an impact or shock, which may be exerted to the passive device 800. The thermoelectric pad 820 may be provided between the passive device 800 and the case 700. The thermoelectric pad 820 may include thermal interface material (TIM). During the operation of the semiconductor module 10, heat generated in the passive device 800 may be transferred or dissipated to the case 700 through thermoelectric pad 820. Further, thermoelectric pad 820 may absorb an impact or shock, which may be exerted to the passive device 800.

The following Table 1 shows a result of a simulation performed to show how temperatures of the control device 300, the buffer semiconductor device 400, the first memory device 500, and the passive device 800 are dependent on the heat-transferring parts 610 and 620, during operation of the semiconductor module 10. A semiconductor module according to a comparative example did not include the lower heat-transferring part 620 and the upper heat-transferring part 610, while semiconductor modules according to experimental examples 1-3 included the lower heat-transferring part 620. Semiconductor modules according to experimental examples 4 and 5 further included the upper heat-transferring part 610 provided on the top surface 100a of the substrate 100.

TABLE 1

| | Heat-transferring Part | | Temperature of Devices during operation (° C.) | | | |
|---|---|---|---|---|---|---|
| | Lower Heat Transferring Path | Upper Heat Transferring Path | Control Device | Buffer Semiconductor Device | First Memory Device | Passive Device |
| Comparative example | — | — | 72.1 | 68.0 | 65.5 | 57.0 |
| Experimental example 1 | Heat Pipe | — | 66.9 | 65.5 | 63.8 | 54.8 |

TABLE 1-continued

| | Heat-transferring Part | | Temperature of Devices during operation (° C.) | | | |
|---|---|---|---|---|---|---|
| | Lower Heat Transferring Path | Upper Heat Transferring Path | Control Device | Buffer Semiconductor Device | First Memory Device | Passive Device |
| Experimental example 2 | Graphite | — | 69.0 | 65.5 | 63.1 | 54.9 |
| Experimental example 3 | Copper | — | 66.7 | 64.5 | 62.1 | 53.4 |
| Experimental example 4 | Copper | Graphite | 65.4 | 65.4 | 61.4 | 55.6 |
| Experimental example 5 | Copper | Heat Pipe | 63.6 | 62.2 | 59.9 | 56.5 |

Referring to the Table 1, during operation of the semiconductor modules, temperatures of the control device 300, the buffer semiconductor device 400, the first memory device 500, and the passive device 800 were lower for the experimental examples 1 to 5 than for the comparative example. This shows that the presence of the lower heat-transferring part 620 provided in the semiconductor module can improve heat dissipation of the control device 300, the buffer semiconductor device 400, the first memory device 500, and the passive device 800. In addition, the simulation results of the experimental examples 4 and 5 show that heat dissipation of the control device 300, the buffer semiconductor device 400, the first memory device 500, and the passive device 800 can be further improved when the upper heat-transferring part 610 is provided in the semiconductor module.

Figure 12:
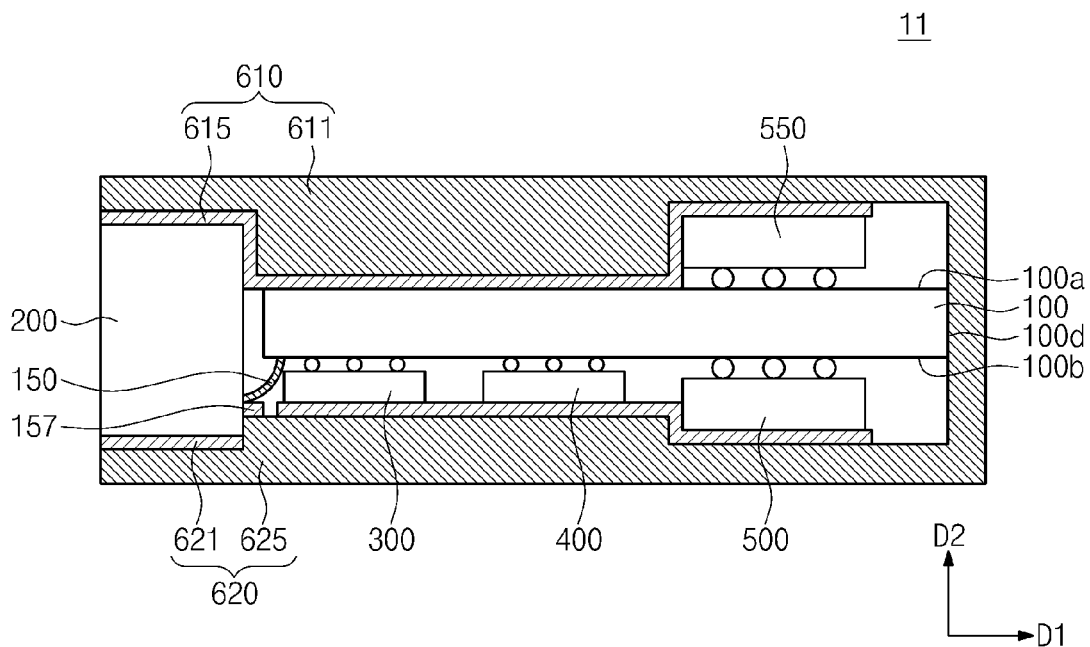

FIG. 12 is a sectional view illustrating a semiconductor module according to another exemplary embodiment. For the sake of brevity, the elements and features of this example that are similar to those previously shown and described will not be described in much further detail.

Referring to FIG. 12, a semiconductor module 11 may include the substrate 100, the connector 200, the control device 300, the buffer semiconductor device 400, the first memory device 500, the second memory device 550, the lower heat-transferring part 620, the upper heat-transferring part 610, and the case 700. The lower heat-transferring part 620 may be configured to have the same or similar features as those of FIGS. 4 through 6. In other exemplary embodiments, the upper heat-transferring part 610 or the case 700 may be omitted.

Interconnection lines 150 may be provided on the bottom surface 100b of the substrate 100. The connector 200 may be electrically connected to the substrate 100 via the interconnection lines 150. Heat generated in the devices 300, 400, 500, and 550 may be transferred to the lower heat-transferring part 620 through the substrate 100 and interconnection lines 150. Interconnection line pad 157 may be interposed between the lower heat-transferring part 620 and the interconnection lines 150. The interconnection line pad 157 may include an electrically insulating thermal interface material (TIM). The interconnection line pad 157 may be in contact with at least one of the interconnection lines 150. In other exemplary embodiments, the interconnection line pad 157 may not be provided.

Figure 13:
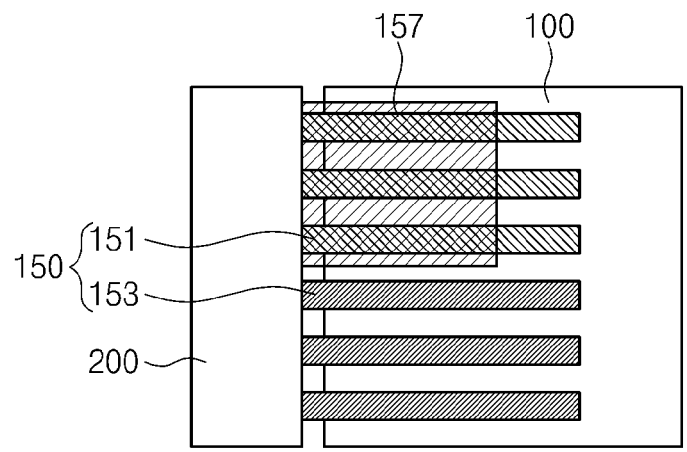
FIGS. 13 and 14 are plan views illustrating interconnection lines according to exemplary embodiments.
Figure 14:
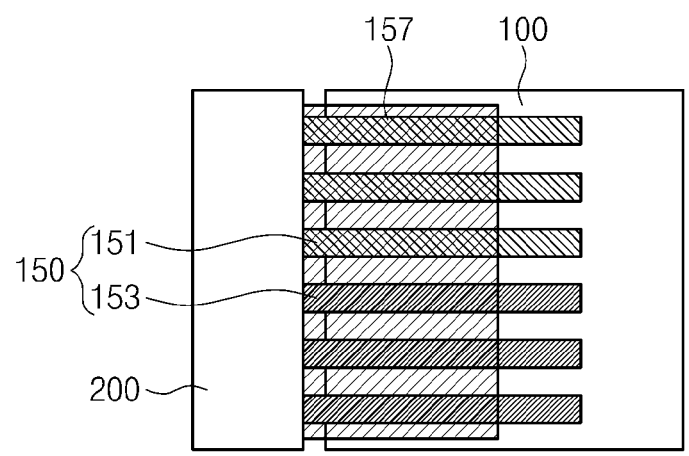

FIGS. 13 and 14 are plan views illustrating interconnection lines according to exemplary embodiments. For example, FIGS. 13 and 14 show the interconnection lines seen in the D2 direction.

Referring to FIG. 13 in conjunction with FIG. 12, the interconnection line pads 157 may be provided on the bottom surface 100b of the substrate 100 to cover a ground interconnection line 151. The ground interconnection line 151 may be connected to the lower heat-transferring part 620 via the interconnection line pad 157. Accordingly, heat generated in the devices 300, 400, 500, and 550 may be easily transferred or dissipated to the lower heat-transferring part 620 through the ground interconnection line 151 and the interconnection line pad 157. The interconnection line pad 157 may not be connected to a power/signal interconnection line 153.

Referring to FIG. 14 in conjunction with FIG. 12, the interconnection line pad 157 may be provided to cover the ground interconnection line 151 and the power/signal interconnection line 153. The ground interconnection line 151 and the power/signal interconnection line 153 may be connected to the lower heat-transferring part 620 via the interconnection line pad 157. This makes it possible to improve heat-dissipation of the devices 300, 400, 500, and 550. The interconnection line pad 157 may be interposed between the interconnection lines 150. Accordingly, it is possible to prevent electric short circuits from occurring between the interconnection lines 150.

Figure 15A:
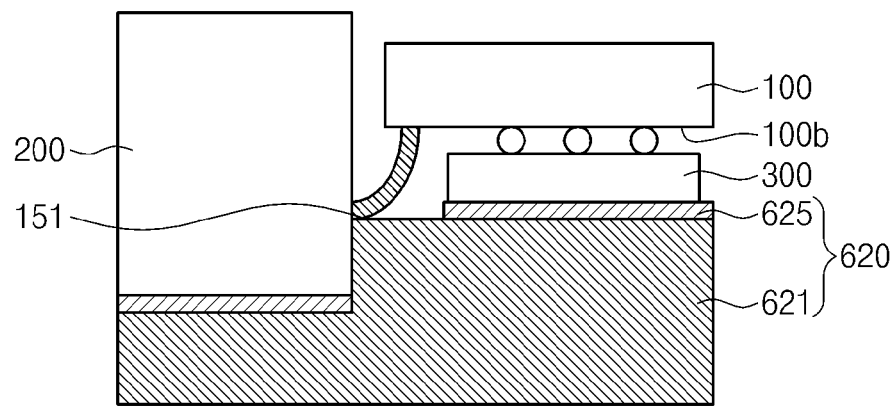
FIG. 15A and FIG. 15B are enlarged sectional views illustrating ground and power/signal interconnection lines according to other exemplary embodiments.
Figure 15B:
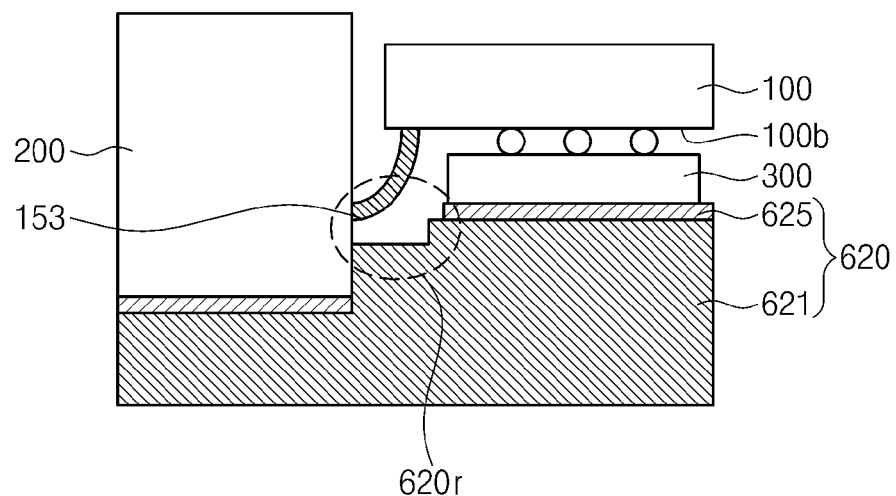

FIG. 15A is an enlarged sectional view illustrating a ground interconnection line according to another exemplary embodiment, and FIG. 15B is an enlarged sectional view illustrating a power/signal interconnection line according to another exemplary embodiment. For the sake of brevity, the elements and features of this example that are similar to those previously shown and described will not be described in much further detail.

Referring to FIG. 15A in conjunction with FIG. 12, the interconnection lines 150 may be provided on the bottom surface 100b of the substrate 100. The connector 200 may be electrically connected to the substrate 100 via the interconnection lines 150. The ground interconnection line 151 may be in contact with the lower heat-transferring part 620. Heat generated in the devices 300, 400, 500, and 550 may be transferred to the lower heat-transferring part 620 through the substrate 100 and the ground interconnection line 151. Here, unlike the embodiments of FIGS. 13 and 14, the interconnection line pad 157 may not be provided. Since the ground interconnection line 151 is in direct contact with the lower heat-transferring part 620, it is possible to suppress an electro-magnetic interference (EMI) from occurring in the semiconductor module and thereby improve electrical characteristics of the semiconductor module 11.

Referring to FIG. 15B in conjunction with FIG. 12, the lower heat-transferring part 620 may be formed to have a recessed portion 620r. The recessed portion 620r may be formed below the power/signal interconnection line 153. Due to the presence of the recessed portion 620r, the lower heat-transferring part 620 can be spaced apart from the power/signal interconnection line 153. Accordingly, the power/signal interconnection line 153 can be electrically separated or cut from the lower heat-transferring part 620. In exemplary embodiments, the interconnection line pad 157 may not be provided. In other exemplary embodiments, the lower heat-transferring part 620 or the lower thermal path 621 may be spaced apart from the side surface of the connector 200.

Figure 16:
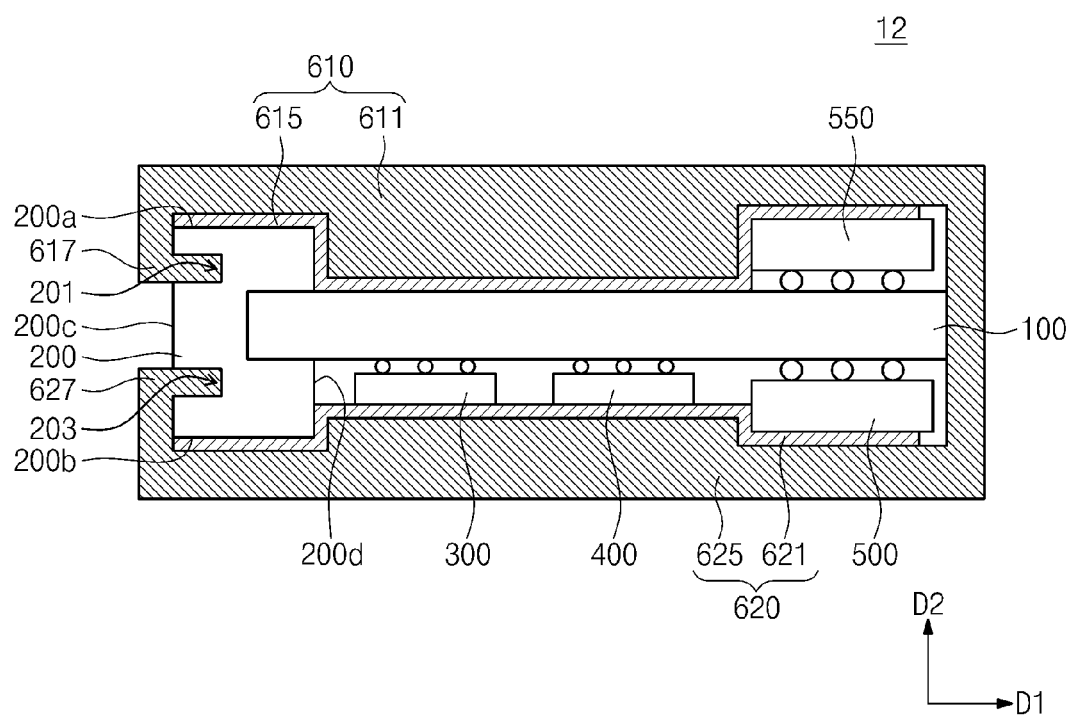
FIG. 16 is a sectional view illustrating a semiconductor module according to another exemplary embodiment.

FIG. 16 is a sectional view illustrating a semiconductor module according to another exemplary embodiment. For the sake of brevity, the elements and features of this example that are similar to those previously shown and described will not be described in much further detail.

Referring to FIG. 16, a semiconductor module 12 may include the substrate 100, the connector 200, the control device 300, the buffer semiconductor device 400, the first memory device 500, the second memory device 550, the lower heat-transferring part 620, and the upper heat-transferring part 610. The lower heat-transferring part 620 and the upper heat-transferring part 610 may be provided to enclose the substrate 100 and serve as a case.

The connector 200 may include a top surface 200a, a bottom surface 200b, a first side surface 200c, and a second side surface 200d facing the first side surface 200c. The first side surface 200c may face the substrate 100. An upper groove 201 may be provided in an upper portion of the first side surface 200c, and a lower groove 203 may be provided in a lower portion of the first side surface 200c. For example, each of the upper groove 201 and the lower groove 203 in the first side surface 200c may be formed to have a shape recessed toward the second side surface 200d.

The lower heat-transferring part 620 may be in contact with the bottom surface 200b and lower portions of the first and second side surfaces 200c and 200d of the connector 200. The lower pad 625 may be provided on the bottom surface 100b of the substrate 100 to be in contact with the control device 300, the buffer semiconductor device 400, and the first memory device 500. The lower pad 625 may be interposed between the lower thermal path 621 and the connector 200. For example, the lower pad 625 may be provided to cover the bottom surface 200b and the lower portions of the first and second side surfaces 200c and 200d of the connector 200. The lower heat-transferring part 620 may include a hook-shaped lower fastening portion 627. The lower fastening portion 627 may extend toward the lower groove 203 of the connector 200 and be jointed to the connector 200. Due to the presence of the lower fastening portion 627, the lower heat-transferring part 627 can be robustly jointed or connected to the connector 200. Further, this leads to an increase in contact area between the lower heat-transferring part 620 and the connector 200, and thus, heat generated in the devices 300, 400, and 500 can be more effectively transferred to the connector 200 through the lower heat-transferring part 620.

The upper heat-transferring part 610 may be in contact with an upper portion of the first side surface 200c, the top surface 200a, and the second side surface 200d of the connector 200. The upper pad 615 may be provided on the substrate 100. The upper pad 615 may be provided to cover the upper portion of the first side surface 200c, the top surface 200a, or the second side surface 200d of the connector 200. The upper heat-transferring part 610 may include a hook-shaped upper fastening portion 617. The upper fastening portion 617 may extend toward, for example, the upper groove 201 of the connector 200. Due to the presence of the upper fastening portion 617, the upper heat-transferring part 610 can be robustly jointed or connected to the connector 200. Further, this makes it possible to increase a contact area between the upper heat-transferring part 610 and the connector 200, and thus, heat transferred to the lower heat-transferring part 620 can be more effectively dissipated or transferred to the connector 200.

In other exemplary embodiments, one of the lower and upper fastening portions 627 and 617 may be omitted.

Figure 17:
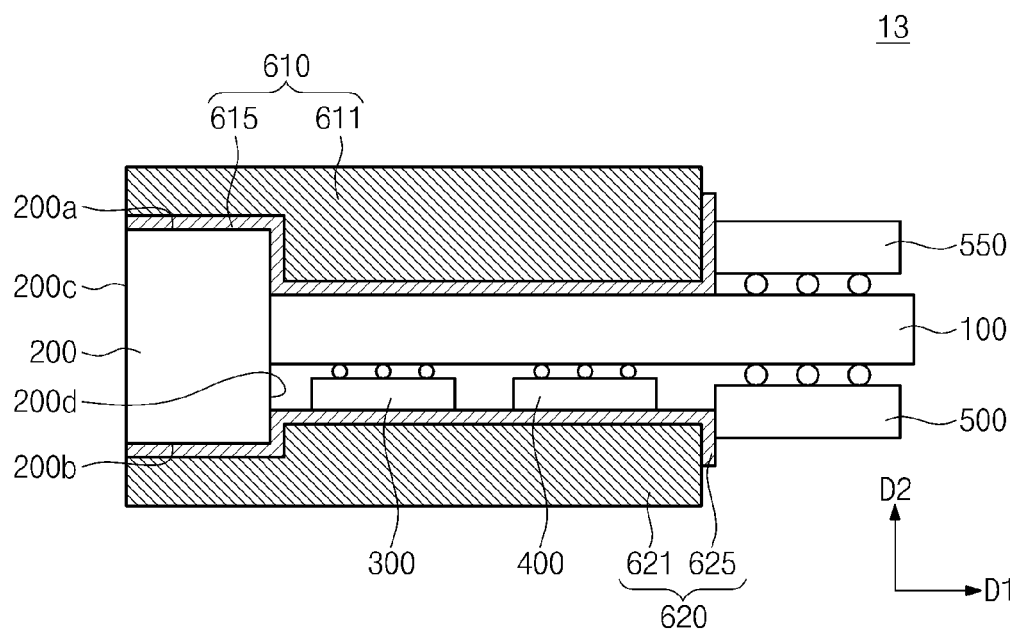
FIG. 17 is a sectional view illustrating a semiconductor module according to another exemplary embodiment.
Figure 18:
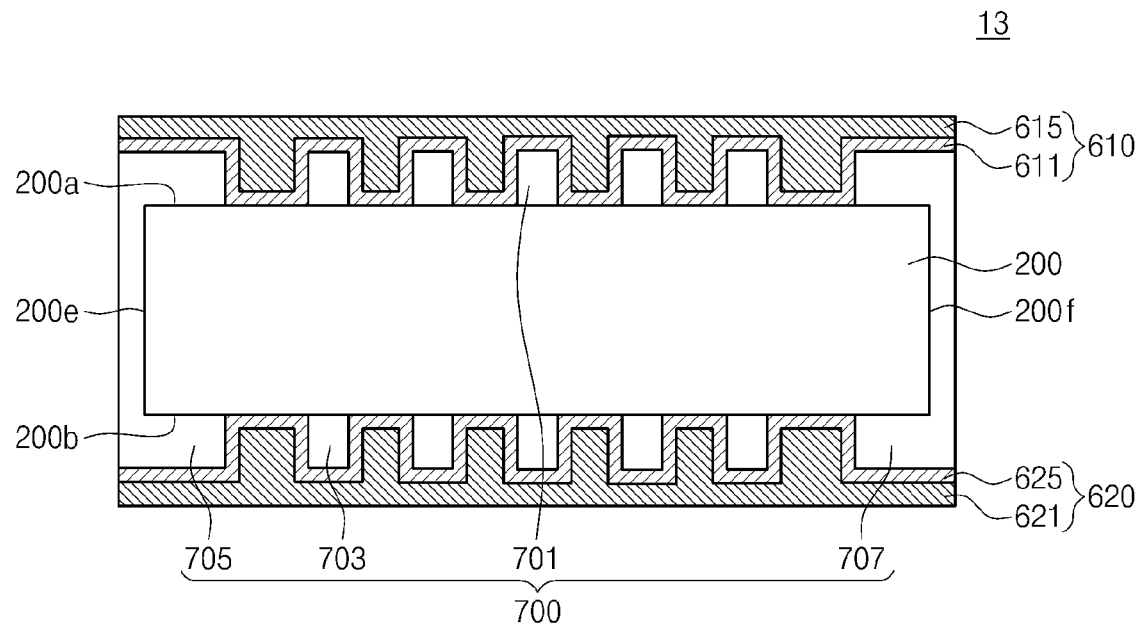
FIG. 18 is a sectional view of the semiconductor module of FIG. 17, which is seen in a D1 direction.

FIG. 17 is a sectional view illustrating a semiconductor module according to another exemplary embodiment. FIG. 18 is a sectional view of the semiconductor module of FIG. 17, which is seen in a D1 direction. For the sake of brevity, the elements and features of this example that are similar to those previously shown and described will not be described in much further detail.

Referring to FIG. 17, a semiconductor module 13 may include the substrate 100, the connector 200, the control device 300, the buffer semiconductor device 400, the first memory device 500, the second memory device 550, the lower heat-transferring part 620, the upper heat-transferring part 610, and the case 700. In other exemplary embodiments, the semiconductor module 13 may not include the lower heat-transferring part 620 or the upper heat-transferring part 610.

The connector 200 may include the first side surface 200c, the second side surface 200d facing the first side surface 200c, a third side surface 200e, and a fourth side surface 200f facing the third side surface 200e.

The case 700 may include first, second, third, and fourth cases 701, 703, 705, and 707. The case 700 may be shaped like a latch. For example, the first case 701 may partially cover the top surface 200a of the connector 200 and protrude from the top surface 200a. The second case 703 may cover partially the bottom surface 200b of the connector 200 and protrude from the bottom surface 200b. The third case 705 may cover the third side surface 200e of the connector 200 and extend to cover a portion of the top surface 200a and a portion of the bottom surface 200b. The fourth case 707 may cover the fourth side surface 200f of the connector 200 and extend to cover a portion of the top surface 200a and a portion of the bottom surface 200b.

The upper heat-transferring part 610 may be provided on the top surface 200a of the connector 200 to be in contact with exposed portions of the top surface 200a of the connector 200 and the first, third, and fourth cases 701, 705, and 707. In other exemplary embodiments, the upper pad 615 may not be provided on the top surface 200a of the connector 200. The lower heat-transferring part 620 may be provided on the bottom surface 200b of the connector 200 to be in contact with exposed portions of the bottom surface 200b of the connector 200 and the second, third, and fourth cases 703, 705, and 707. In other exemplary embodiments, the lower pad 625 may not be provided on the bottom surface 200b of the connector 200. According to the present exemplary embodiment, the heat-transferring parts 610 and 620 can be in contact with the case 700 with an increased contact area. The connector 200 can be robustly joined to not only the case 700 but also the upper heat-transferring part 610 and the lower heat-transferring part 620.

According to exemplary embodiments, a semiconductor module may include a heat-transferring part connecting at least one of a control device, a buffer semiconductor device, and memory devices to a connector. Accordingly, during operation of the semiconductor module, a temperature of the connector can be lower than that of the at least one device connected to the heat-transferring part. The heat-transferring part may be configured to have a thermal conductivity higher than air. Heat generated in the devices of the semiconductor module can be easily transferred or dissipated to the connector through the heat-transferring part. Accordingly, it is possible to improve heat-dissipation and reliability of the semiconductor module.

While exemplary embodiments have been particularly shown and described, it will be understood by one of ordinary skill in the art that variations in form and detail may be made therein without departing from the spirit and scope of the attached claims.

What is claimed is:

1. A semiconductor module comprising:
a substrate;
a control device mounted on a bottom surface of the substrate;
a buffer semiconductor device mounted on the bottom surface of the substrate;
a memory device mounted on the bottom surface of the substrate;
a heat-transferring part contacting the control device;
an electrical connector that is configured to connect the semiconductor module to an external device and that is provided on a side surface of the substrate and contacting the heat-transferring part;
a passive device pad disposed on a top surface of the substrate;
a passive device disposed on the passive device pad;
a thermoelectric pad disposed on the passive device; and
a case contacting the thermoelectric pad and surrounding the substrate, the passive device pad, the passive device, and the thermoelectric pad.

2. The semiconductor module of claim 1, wherein the heat-transferring part has a thermal conductivity that is higher than a thermal conductivity of the substrate.

3. The semiconductor module of claim 1, wherein the heat-transferring part comprises:
a thermal path; and
a pad provided between the thermal path and the connector and between the thermal path and the control device.

4. The semiconductor module of claim 3, wherein the heat-transferring part extends to contact the buffer semiconductor device, and
the pad extends between the buffer semiconductor device and the connector.

5. The semiconductor module of claim 3, wherein the heat-transferring part extends to contact the memory device, and
the pad extends between the memory device and the connector.

6. The semiconductor module of claim 1, further comprising interconnection lines contacting the substrate and the connector,
wherein the interconnection lines comprise:
a power/signal interconnection line spaced apart from the heat-transferring part; and
a ground interconnection line contacting the heat-transferring part.

7. A semiconductor module comprising:
a substrate;
a control device mounted on a bottom surface of the substrate;
a buffer semiconductor device mounted on the bottom surface of the substrate;
a first memory device mounted on the bottom surface of the substrate;
a second memory device mounted on a top surface of the substrate;
an upper heat-transferring part provided on the top surface of the substrate and contacting the second memory device;
an electrical connector that is configured to connect the semiconductor module to an external device and that is provided on a first side surface of the substrate and contacting the upper heat-transferring part;
a passive device pad disposed on the top surface of the substrate;
a passive device disposed on the passive device pad;
a thermoelectric pad disposed on the passive device; and
a case contacting the thermoelectric pad and surrounding the substrate, the passive device pad, the passive device, and the thermoelectric pad.

8. The semiconductor module of claim 7, wherein the upper heat-transferring part has a thermal conductivity that is higher than a thermal conductivity of the substrate.

9. The semiconductor module of claim 7, further comprising a lower heat-transferring part contacting the connector and at least one of the control device, the buffer semiconductor device, and the first memory device.

10. The semiconductor module of claim 9, wherein the upper heat-transferring part extends along a second side surface of the substrate and is connected to the lower heat-transferring part, and
the substrate is enclosed by the upper heat-transferring part, the lower heat-transferring part and the connector.

11. The semiconductor module of claim 10, wherein the upper heat-transferring part has a top surface spaced apart from the substrate and having a groove, zigzag, or uneven shape.

12. A semiconductor module comprising:
a substrate;
an electrical connector that is configured to connect the semiconductor module to an external device and that is provided on a side surface of the substrate;
at least one of a control device, a buffer semiconductor device, a first memory device and a second memory device, mounted on a surface of the substrate;
a first heat-transferring part contacting the connector and the at least one of the control device, the buffer semiconductor device, the first memory device and the second memory device, wherein the first heat-transferring part is configured to transfer heat generated in the at least one of the control device, the buffer semiconductor device, the first memory device and the second memory device to the connector;
a passive device pad disposed on a top surface of the substrate;
a passive device disposed on the passive device pad;
a thermoelectric pad disposed on the passive device; and
a case contacting the thermoelectric pad and surrounding the substrate, the passive device pad, the passive device, and the thermoelectric pad.

13. The semiconductor module of claim 12, wherein the first heat-transferring part has a thermal conductivity that is higher than a thermal conductivity of the substrate.

14. The semiconductor module of claim 12, wherein the first heat-transferring part comprises:
a first thermal path; and
a first pad disposed between the first thermal path and the connector and between the thermal path and the at least one of the control device, the buffer semiconductor device, the first memory device and the second memory device.

15. The semiconductor module of claim 12, further comprising a second heat-transferring part contacting the connector and the second memory device, and configured to transfer heat generated in the second memory device to the connector,
- wherein the surface of the substrate comprises the top surface of the substrate and a bottom surface of the substrate, and
- wherein the second memory device is mounted on the top surface of substrate,
- the control device, the buffer semiconductor device and the first memory device are mounted on the bottom surface of the substrate, and
- the first heat-transferring part contacts the control device and is configured to transfer heat generated in the control device to the connector.

16. The semiconductor module of claim 15, wherein the first heat-transferring part contacts the buffer semiconductor device.

17. The semiconductor module of claim 15, wherein the first heat-transferring part contacts the buffer semiconductor device and the first memory device.

18. The semiconductor module of claim 15, wherein the second heat-transferring part is connected to the first heat-transferring part, and
- the substrate is enclosed by the first heat-transferring part, the second heat-transferring part and the connector.

19. The semiconductor module of claim 15, wherein at least one of the first heat-transferring part and the second heat-transferring part has a surface having a groove, zigzag, or uneven shape.

* * * * *